United States Patent
Ke

(10) Patent No.: US 11,322,725 B2
(45) Date of Patent: May 3, 2022

(54) FLEXIBLE DISPLAY PANEL HAVING REFRACTIVE LAYER STRUCTURE IN TRANSPARENT DISPLAY AREA AND FLEXIBLE DISPLAY DEVICE HAVING THE FLEXIBLE DISPLAY PANEL

(71) Applicant: WUHAN CHINA STAR OPTOELECTRONICS SEMICONDUCTOR DISPLAY TECHNOLOGY CO., LTD., Hubei (CN)

(72) Inventor: Linbo Ke, Hubei (CN)

(73) Assignee: WUHAN CHINA STAR OPTOELECTRONICS SEMICONDUCTOR DISPLAY TECHNOLOGY CO., LTD., Hubei (CN)

( * ) Notice: Subject to any disclaimer, the term of this patent is extended or adjusted under 35 U.S.C. 154(b) by 384 days.

(21) Appl. No.: 16/494,871

(22) PCT Filed: May 9, 2019

(86) PCT No.: PCT/CN2019/086157
§ 371 (c)(1),
(2) Date: Sep. 17, 2019

(87) PCT Pub. No.: WO2020/186608
PCT Pub. Date: Sep. 24, 2020

(65) Prior Publication Data
US 2021/0336225 A1    Oct. 28, 2021

(30) Foreign Application Priority Data
Mar. 21, 2019    (CN) .......................... 201910218017.7

(51) Int. Cl.
*H01L 51/52* (2006.01)
*H01L 27/32* (2006.01)
*H01L 51/00* (2006.01)

(52) U.S. Cl.
CPC ...... *H01L 51/5275* (2013.01); *H01L 27/3244* (2013.01); *H01L 51/0097* (2013.01); *H01L 2251/5338* (2013.01)

(58) Field of Classification Search
None
See application file for complete search history.

(56) References Cited

U.S. PATENT DOCUMENTS

2017/0005154 A1    1/2017  You et al.
2020/0295300 A1*  9/2020  Chung ................ G06F 1/1684
(Continued)

FOREIGN PATENT DOCUMENTS

| CN | 108459431 A | 8/2018 |
|---|---|---|
| CN | 109116621 A | 1/2019 |
| CN | 208386636 U | 1/2019 |

*Primary Examiner* — Nduka E Ojeh

(57) ABSTRACT

A flexible display panel and a display device are provided. The flexible display panel includes a display area, the display area includes a transparent display area and a non-transparent display area surrounding the transparent display area. In the display area, the flexible display panel includes a base layer structure, a thin film transistor layer, an organic light emitting diode layer, and a packaging layer. The thin film transistor layer is disposed on the base layer structure. The organic light emitting diode layer is disposed on the thin film transistor layer. The packaging layer is disposed on the organic light emitting diode layer. In the transparent display area, the flexible display further includes at least one set of refractive layer structure.

11 Claims, 2 Drawing Sheets

(56) References Cited

U.S. PATENT DOCUMENTS

| | | | |
|---|---|---|---|
| 2021/0065625 A1* | 3/2021 | Wang | H01L 27/3234 |
| 2021/0066408 A1* | 3/2021 | Wu | H01L 27/3244 |
| 2021/0175303 A1* | 6/2021 | Bang | H01L 27/3246 |
| 2021/0223607 A1* | 7/2021 | Liu | G02B 1/11 |

* cited by examiner

FLEXIBLE DISPLAY PANEL HAVING REFRACTIVE LAYER STRUCTURE IN TRANSPARENT DISPLAY AREA AND FLEXIBLE DISPLAY DEVICE HAVING THE FLEXIBLE DISPLAY PANEL

FIELD OF INVENTION

The present invention relates to the field of display technologies, and more particularly to a flexible display panel and a display device.

BACKGROUND OF INVENTION

Intelligent terminals (e.g.: mobile phones, tablets, etc.) have gradually become an integral part of people's lives due to integrating convenience, entertainment, and function diversity. However, with the continuous development of intelligent terminal technology, more advanced technologies are applied to the intelligent terminals, which greatly enriches people's lives. Nevertheless, people's requirements and expectations for intelligent terminals also increase at the same time. As people enjoy the basic functions of the intelligent terminals (e.g.: mobile phones, tablets, etc.), people apply for higher requirements of the intelligent terminals at the same time, such as a design of intelligent terminal flexible display panel.

With the rapid development of modern display technology, the field of display technologies develops toward lighter, thinner, more flexible, more transparent. The conventional glass substrate is difficult to meet the requirements of the future flexible display technology due to its hard and brittle properties. Polymer film substrates are light, flexible, and good comprehensive performance to meet the flexibility requirement of the flexible display technology well. Therefore, the flexible polymer substrate material is the material of choice for future flexible display technology.

Nowadays, the most promising polymer material for flexible film substrates is polyimide (PI). Polyimide has excellent heat resistance, resistance to radiation, chemical stability, electrical insulating properties, and mechanical properties. However, the average visible light transmittance of polyimide is only 70%. Furthermore, the total light transmittance decreases with superposing different film layers of display panel.

The under-display camera technique requires a high total light transmittance of the camera area on the display panel. However, the current technique only provides the line arrangement in the display of the camera but not relates to the structure of the flexible film substrate. Therefore, the camera behind the display panel still can't receive sufficient lights, which makes the brightness of the collected image and the image quality lower.

SUMMARY OF INVENTION

The present invention provides a flexible display panel and a display device to solve the total light transmittance of the camera area on the display panel is too low in the conventional technique. When the total light transmittance of the camera area on the display panel is too low, the camera behind the display panel can't receive sufficient lights, which makes the brightness of the collected image and the image quality lower.

For solving the above problems, the present invention provides a flexible display panel, the flexible display panel includes a display area, the display area includes a transparent display area and a non-transparent display area surrounding the transparent display area.

In the display area, the flexible display panel includes a base layer structure, a thin film transistor layer, an organic light emitting diode layer, and a packaging layer. The thin film transistor layer is disposed on the base layer structure. The organic light emitting diode layer is disposed on the thin film transistor layer. The packaging layer is disposed on the organic light emitting diode layer.

In the transparent display area, the flexible display further includes at least one set of refractive layer structure.

Further, the refractive layer structure includes a first refractive layer, a second refractive layer, and a third refractive layer. The first refractive layer includes a light incident side and a light outgoing side. The second refractive layer includes a light incident side and a light outgoing side, wherein the light incident side of the second refractive layer is disposed on the light outgoing side of the first refractive layer. The third refractive layer includes a light incident side and a light outgoing side, wherein the light incident side of the third refractive layer is disposed on the light outgoing side of the second refractive layer. The refractive index of the first refractive layer is lower than the refractive index of the second refractive layer. The refractive index of the second refractive layer is lower than the refractive index of the third refractive layer.

Further, the flexible display panel further includes a reflective layer surrounding the periphery of the refractive layer structure.

Further, the refractive layer structure is cylindrical or truncated cone and includes a bottom surface and a top surface, wherein the top surface is at the light incident side of the first refractive layer, and the bottom surface is at the light outgoing side of the third refractive layer. The diameter of the bottom surface is equal to or smaller than the diameter of the top surface.

Further, when the flexible display panel includes two or more refractive layer structures, the diameter of the top surface of the lower level refractive layer structure is equal to or smaller than the diameter of the bottom surface of the upper level refractive layer structure.

Further, the refractive layer structure is disposed in the base layer structure and/or the thin film transistor layer, and corresponds to the transparent display area.

Further, the base layer structure includes a first base layer, a first barrier layer, a second base layer, and a second barrier layer. The first barrier layer is disposed on the first base layer. The second base layer is disposed on the first barrier layer. The second barrier layer is disposed on the second base layer, and the thin film transistor layer is disposed on the second barrier layer. When the refractive layer structures are disposed in the base layer structure, the refractive layer structures are disposed in the first base layer and the second base layer.

Further, the organic light emitting diode layer includes a plurality of pixels arranged in an array on the thin film transistor layer. A pixel density of the transparent display area is less than a pixel density of the non-transparent display area. A pixel size of the transparent display area is less than a pixel size of the non-transparent display area.

Further, the organic light emitting diode layer further includes a light blocking layer disposed on the organic light emitting diode layer and surrounding the transparent display area.

The present invention further provides a display device, including the flexible display panel as the above description and a camera, wherein the camera and the transparent display area correspond to each other.

Advantage of the present invention: The present invention is a flexible display panel. A refractive layer structure is disposed in a transparent display area corresponding to a camera, and the refractive layer structure is a combination of several refractive layers and a reflective layer. When lights enter the transparent display area, due to the refractions and the reflections in the refractive layers and the reflective layer of the refractive layer structure, the incident lights from different directions converge to a bundle of light, pass through the flexible display panel, and then focus on the camera, which increases the total light transmittance of the film layers in the camera area to make the camera behind the display panel receive sufficient lights and increase the brightness of the collected image and the image quality, thereby realizing a better under-display camera technique.

Figure 1:
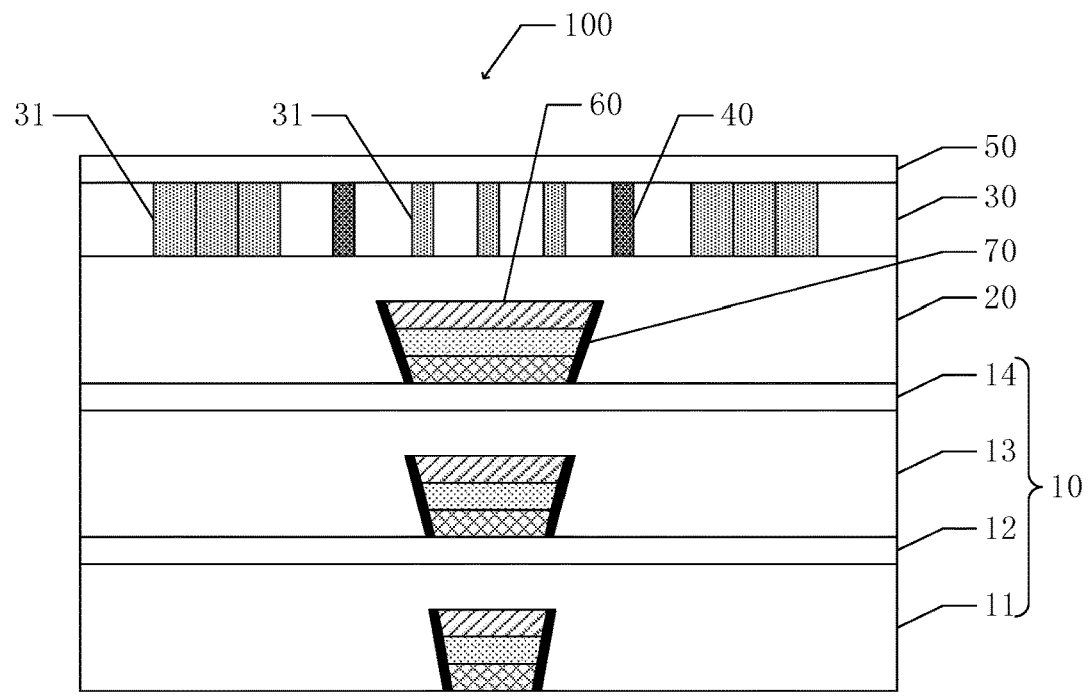
FIG. 1 is a schematic cross-sectional layers of a flexible display panel according to a first embodiment of the present invention.

Components are identified as follows: a flexible display panel 100; a base layer 10; a first base layer 11; a first barrier layer 12; a second base layer 13; a second barrier layer 14; a thin film transistor layer 20; an organic light emitting diode layer 30; a pixel 31; a light blocking layer 40; a packaging layer 50; a refractive layer structure 60; a first refractive layer 61; a second refractive layer 62; a third refractive layer 63; a light incident side 64; a light outgoing side 65; a reflective layer 70; and a camera 200.

DETAILED DESCRIPTION OF PREFERRED EMBODIMENTS

The embodiments of the present disclosure are described in detail hereinafter. Examples of the described embodiments are given in the accompanying drawings, wherein the identical or similar reference numerals constantly denote the identical or similar elements or elements having the identical or similar functions. The specific embodiments described with reference to the attached drawings are all exemplary and are intended to illustrate and interpret the present disclosure, which shall not be construed as causing limitations to the present disclosure.

In the drawings, the same structural elements denoted by the same reference numbers throughout the structure or functionally similar components are designated with similar reference numbers. Size and thickness of each component shown in the drawings are arbitrarily illustrated, the present invention is not limited in size and thickness of each component. To make the illustration clearer, the accompanying drawings are exaggerated in some places the appropriate thickness of the part.

In the description of the present disclosure, it should be understood that terms such as "center," "longitudinal," "lateral," "length," "width," "thickness," "upper," "lower," "front," "rear," "left," "right," "vertical," "horizontal," "top," "bottom," "inside," "outside," "clockwise," "counterclockwise" as well as derivative thereof should be construed to refer to the orientation as then described or as shown in the drawings under discussion. These relative terms are for convenience of description, do not require that the present disclosure be constructed or operated in a particular orientation, and shall not be construed as causing limitations to the present disclosure. In addition, terms such as "first" and "second" are used herein for purposes of description and are not intended to indicate or imply relative importance or significance. Thus, features limited by "first" and "second" are intended to indicate or imply including one or more than one these features. In the description of the present disclosure, "a plurality of" relates to two or more than two, unless otherwise specified.

In the description of the present disclosure, it should be noted that unless there are express rules and limitations, the terms such as "mount," "connect," and "bond" should be comprehended in broad sense. For example, it can mean a permanent connection, a detachable connection, or an integrate connection; it can mean a mechanical connection, an electrical connection, or can communicate with each other; it can mean a direct connection, an indirect connection by an intermediate, or an inner communication or an interaction between two elements. A person skilled in the art should understand the specific meanings in the present disclosure according to specific situations.

In the description of the present disclosure, unless specified or limited otherwise, it should be noted that, a structure in which a first feature is "on" or "beneath" a second feature may include an embodiment in which the first feature directly contacts the second feature and may also include an embodiment in which an additional feature is formed between the first feature and the second feature so that the first feature does not directly contact the second feature. Furthermore, a first feature "on," "above," or "on top of" a second feature may include an embodiment in which the first feature is right "on," "above," or "on top of" the second feature and may also include an embodiment in which the first feature is not right "on," "above," or "on top of" the second feature, or just means that the first feature has a sea level elevation greater than the sea level elevation of the second feature. While first feature "beneath," "below," or "on bottom of" a second feature may include an embodiment in which the first feature is right "beneath," "below," or "on bottom of" the second feature and may also include an embodiment in which the first feature is not right "beneath," "below," or "on bottom of" the second feature, or just means that the first feature has a sea level elevation less than the sea level elevation of the second feature.

The disclosure herein provides many different embodiments or examples for realizing different structures of the present disclosure. In order to simplify the disclosure of the present disclosure, components and settings of specific examples are described below. Of course, they are only examples and are not intended to limit the present disclosure. Furthermore, reference numbers and/or letters may be repeated in different examples of the present disclosure. Such repetitions are for simplification and clearness, which per se do not indicate the relations of the discussed embodiments and/or settings. Moreover, the present disclosure provides examples of various specific processes and materials, but the applicability of other processes and/or application of other materials may be appreciated by a person skilled in the art.

A First Embodiment

As shown in FIG. 1, the first embodiment of the present invention provides a flexible display panel 100 including a display area. The display area includes a transparent display area and a non-transparent display area surrounding the transparent display area. The non-transparent display area provides display screens for users. The transparent display area can provide not only an optical channel for a camera 200 but also display screens for users, thereby realizing a full screen display.

In the display area, the flexible display panel 100 includes a base layer structure 10, a thin film transistor layer 20, an organic light emitting diode layer 30, and a packaging layer 50.

The base layer structure 10 includes a first base layer 11, a first barrier layer 12, a second base layer 13, and a second barrier layer 14. The first barrier layer 12 is disposed on the first base layer 11. The second base layer 13 is disposed on the first barrier layer 12. The second barrier layer 14 is disposed on the second base layer 13. The materials of the first base layer 11 and the second base layer 13 are polyimide (PI), which makes the flexible display panel 100 has flexibility. In the first embodiment of the present invention, the base layer structure 10 is a multilayer structure. However, in the other embodiments of the present invention, the base layer structure 10 can also be a single layer structure, for example, a structure has only one base layer.

The thin film transistor layer 20 is disposed on the second barrier layer 14, formed with a plurality of thin film transistors arranged in an array, and used for controlling the organic light emitting diode layer 30.

The organic light emitting diode layer 30 is disposed on the thin film transistor layer 20, and the flexible display panel 100 achieves displaying the display screen by the organic light emitting diode layer 30.

The organic light emitting diode layer 30 includes a plurality of pixels 31, the pixels 31 are arranged in an array on the thin film transistor layer 20. A pixel 31 density of the transparent display area is less than a pixel 31 density of the non-transparent display area, and a pixel 31 size of the transparent display area is less than a pixel 31 size of the non-transparent display area. The present design makes lights pass through the organic light emitting diode layer 30 easier and decreases the loss of lights. Furthermore, the flexible display panel 100 also realizes a real full screen display.

The packaging layer 50 is disposed on the organic light emitting diode layer 30, can be a single layer structure or a structure stacked by organic layers and inorganic layers alternately, and is used for insulating water and oxygen to protect the devices in the flexible display panel 100.

In the transparent display area, the flexible display panel 100 further includes three sets of refractive layer structure 60.

Figure 3:
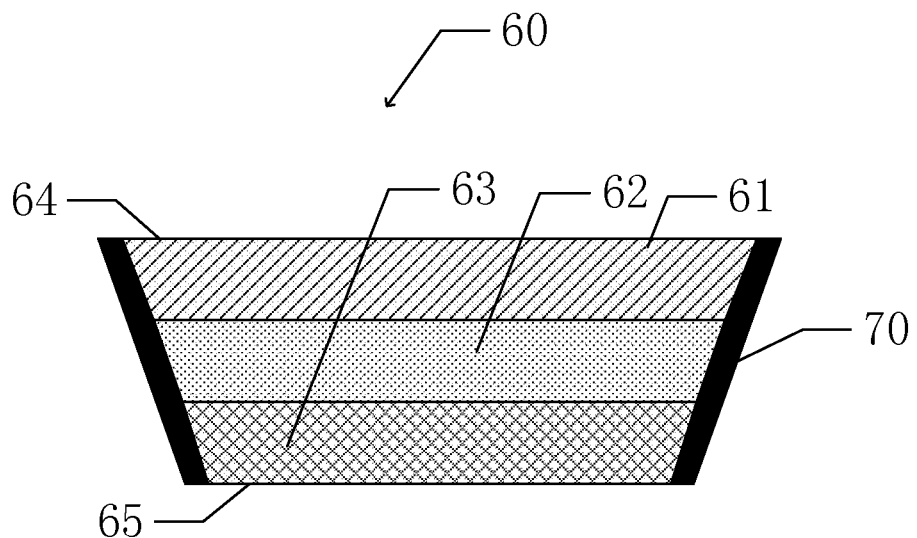
FIG. 3 is a schematic cross-sectional layers of a refractive layer structure according to a first embodiment and a second embodiment of the present invention.

As shown in FIG. 3, the refractive layer structure 60 includes a first refractive layer 61, a second refractive layer 62, and a third refractive layer 63. The first refractive layer 61 includes a light incident side 64 and a light outgoing side 65. The second refractive layer 62 also includes a light incident side 64 and a light outgoing side 65, wherein the light incident side 64 of the second refractive layer 62 is disposed on the light outgoing side 65 of the first refractive layer 61. The third refractive layer 63 also includes a light incident side 64 and a light outgoing side 65, wherein the light incident side 64 of the third refractive layer 63 is disposed on the light outgoing side 65 of the second refractive layer 62. The refractive layer structure 60 is truncated cone and includes a bottom surface and a top surface. The top surface is at the light incident side 64 of the first refractive layer 61, and the bottom surface is at the light outgoing side 65 of the third refractive layer 63. The diameter of the bottom surface is smaller than the diameter of the top surface.

The refractive index of the first refractive layer 61 is lower than the refractive index of the second refractive layer 62, and the refractive index of the second refractive layer 62 is lower than the refractive index of the third refractive layer 63. The refractive layer structure 60 is a graded refractive index structure. The refractive indexes sequentially increase from the first refractive layer 61 to the third refractive layer 63, which causes incident lights from different directions to converge to a bundle of light with the sequentially increasing refractive index, thereby achieving the convergence of lights, decreasing the loss of lights during transmitting, and increasing the light transmittance.

The flexible display panel 100 further includes a reflective layer 70, the reflective layer 70 surrounds the periphery of the refractive layer structure 60. The reflective layer 70 is used for reflecting and converging the lights in the refractive layer structure 60 and decreasing the loss of lights.

The first embodiment of the present invention has three sets of refractive layer structure 60 disposed in the thin film transistor layer 20, the first base layer 11, and the second base layer 13, respectively. The diameter of the top surface of the refractive layer structure 60 in the second base layer 13 is equal to or smaller than the diameter of the bottom surface of the refractive layer structure 60 in the thin film transistor layer 20. The diameter of the top surface of the refractive layer structure 60 in the first base layer 11 is equal to or smaller than the diameter of the bottom surface of the refractive layer structure 60 in the second base layer 13. Furthermore, the center lines of the three refractive layer structures 60 overlap with each other, the volumes of the three refractive layer structures 60 sequentially decrease from the top thin film transistor layer 20 to the bottom first base layer 11, the areas of bottom surfaces of the three refractive layer structures 60 also sequentially decrease from the top thin film transistor layer 20 to the bottom first base layer 11, and the size of the camera 200 can also be reduced according to the reduction of the area of the bottom surface, thereby achieving a reduction of the occupied space of the camera 200.

In the first embodiment of the present invention, a display device (not shown) includes the flexible display panel 100 as the above description and a camera 200, wherein the camera 200 is disposed on the side near the base layer structure of the flexible display panel 100 and corresponds to the transparent display area. The display device has the effect of full screen display and can be any product or device with display function (e.g.: mobile phones, tablets, laptop, etc.).

In the first embodiment of the present invention, several refractive layer structures 60 are disposed in the flexible display panel 100. The refractive layer structure 60 is a combination of several refractive layers and a reflective layer 70, and the refractive layer structure 60 is a graded refractive index structure that the refractive indexes of refractive layers are sequentially increased. When lights enter the transparent display area, due to the refractions and the reflections in the refractive layers and the reflective layer 70 of the refractive layer structure 60, the incident lights from different directions converge to a bundle of light, pass through the flexible display panel 100, and then focus on the camera 200, which increases the total light transmittance of the film layers in the camera 200 area to make the camera 200 behind the display panel receive sufficient lights and increase the brightness of the collected image and the image quality, thereby realizing a better under-display camera technique.

A Second Embodiment

Figure 2:
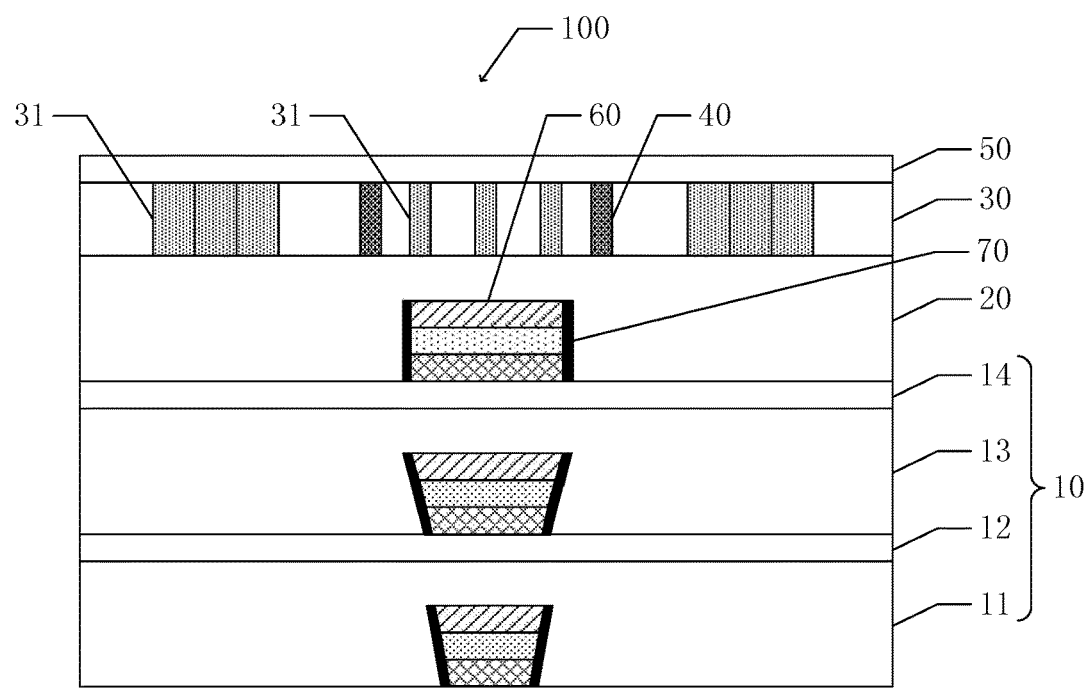
FIG. 2 is a schematic cross-sectional layers of a flexible display panel according to a second embodiment of the present invention.

As shown in FIG. 2, the second embodiment of the present invention provides a flexible display panel 100 including a display area. The display area includes a transparent display area and a non-transparent display area surrounding the transparent display area. The non-transparent display area provides display screens for users. The transparent display area can provide not only an optical channel for a camera 200 but also display screens for users, thereby realizing a full screen display.

In the display area, the flexible display panel 100 includes a base layer structure 10, a thin film transistor layer 20, an organic light emitting diode layer 30, and a packaging layer 50.

The base layer structure 10 includes a first base layer 11, a first barrier layer 12, a second base layer 13, and a second barrier layer 14. The first barrier layer 12 is disposed on the first base layer 11. The second base layer 13 is disposed on the first barrier layer 12. The second barrier layer 14 is disposed on the second base layer 13. The materials of the first base layer 11 and the second base layer 13 are polyimide (PI), which makes the flexible display panel 100 has flexibility. In the second embodiment of the present invention, the base layer structure 10 is a multilayer structure. However, in the other embodiments of the present invention, the base layer structure 10 can also be a single layer structure, for example, a structure has only one base layer.

The thin film transistor layer 20 is disposed on the second barrier layer 14, formed with a plurality of thin film transistors arranged in an array, and used for controlling the organic light emitting diode layer 30.

The organic light emitting diode layer 30 is disposed on the thin film transistor layer 20, and the flexible display panel 100 achieves displaying the display screen by the organic light emitting diode layer 30.

The organic light emitting diode layer 30 includes a plurality of pixels 31, the pixels 31 are arranged in an array on the thin film transistor layer 20. A pixel 31 density of the transparent display area is less than a pixel 31 density of the non-transparent display area, and a pixel 31 size of the transparent display area is less than a pixel 31 size of the non-transparent display area. The present design makes lights pass through the organic light emitting diode layer 30 easier and decreases the loss of lights. Furthermore, the flexible display panel 100 also realizes a real full screen display.

The packaging layer 50 is disposed on the organic light emitting diode layer 30, can be a single layer structure or a structure stacked by organic layers and inorganic layers alternately, and is used for insulating water and oxygen to protect the devices in the flexible display panel 100.

In the transparent display area, the flexible display panel 100 further includes three sets of refractive layer structure 60.

Figure 4:
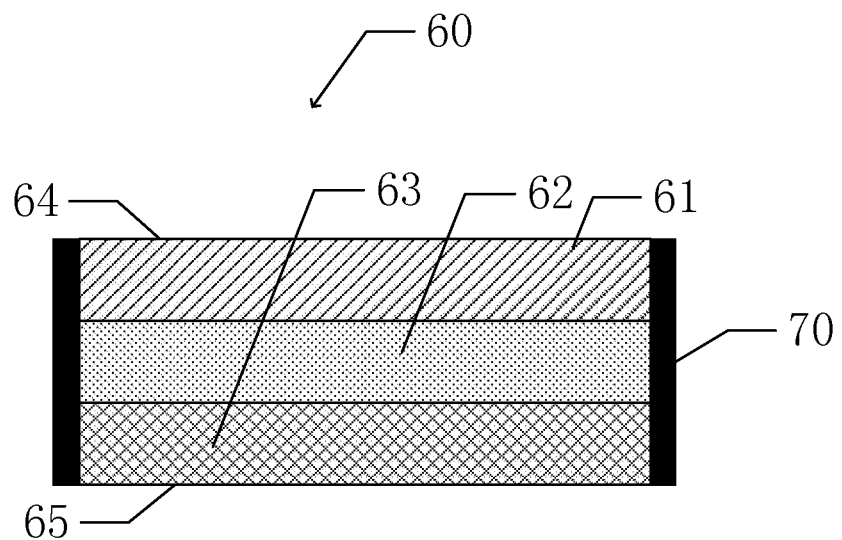
FIG. 4 is a schematic cross-sectional layers of a refractive layer structure according to a second embodiment of the present invention.

As shown in FIG. 3 and FIG. 4, the refractive layer structure 60 includes a first refractive layer 61, a second refractive layer 62, and a third refractive layer 63. The first refractive layer 61 includes a light incident side 64 and a light outgoing side 65. The second refractive layer 62 also includes a light incident side 64 and a light outgoing side 65, wherein the light incident side 64 of the second refractive layer 62 is disposed on the light outgoing side 65 of the first refractive layer 61. The third refractive layer 63 also includes a light incident side 64 and a light outgoing side 65, wherein the light incident side 64 of the third refractive layer 63 is disposed on the light outgoing side 65 of the second refractive layer 62. The refractive layer structure 60 is truncated cone and includes a bottom surface and a top surface. The top surface is at the light incident side 64 of the first refractive layer 61, and the bottom surface is at the light outgoing side 65 of the third refractive layer 63.

The refractive index of the first refractive layer 61 is lower than the refractive index of the second refractive layer 62, and the refractive index of the second refractive layer 62 is lower than the refractive index of the third refractive layer 63. The refractive layer structure 60 is a graded refractive index structure. The refractive indexes sequentially increase from the first refractive layer 61 to the third refractive layer 63, which causes incident lights from different directions to converge to a bundle of light with the sequentially increasing refractive index, thereby achieving the convergence of lights, decreasing the loss of lights during transmitting, and increasing the light transmittance.

The flexible display panel 100 further includes a reflective layer 70, the reflective layer 70 surrounds the periphery of the refractive layer structure 60. The reflective layer 70 is used for reflecting and converging the lights in the refractive layer structure 60 and decreasing the loss of lights.

The second embodiment of the present invention has three sets of refractive layer structure 60 disposed in the thin film transistor layer 20, the first base layer 11, and the second base layer 13, respectively. The refractive layer structure 60 in the film transistor layer 20 is cylindrical, and the diameter of bottom surface of the refractive layer structure 60 is equal to the diameter of the top surface of the refractive layer structure 60 in the thin film transistor layer. The refractive layer structure 60 in the first base layer 11 and the second base layer 13 is truncated cone, and the diameter of bottom surface of the refractive layer structure 60 is smaller than the diameter of the top surface of the refractive layer structure 60 in the first base layer 11 and the second base layer 13.

The diameter of the top surface of the refractive layer structure 60 in the second base layer 13 is equal to or smaller than the diameter of the bottom surface of the refractive layer structure 60 in the thin film transistor layer 20. The diameter of the top surface of the refractive layer structure 60 in the first base layer 11 is equal to or smaller than the diameter of the bottom surface of the refractive layer structure 60 in the second base layer 13. Furthermore, the center lines of the three refractive layer structures 60 overlap with each other, the volumes of the three refractive layer structures 60 sequentially decrease from the top thin film transistor layer 20 to the bottom first base layer 11, the areas of bottom surfaces of the three refractive layer structures 60 also sequentially decrease from the top thin film transistor layer 20 to the bottom first base layer 11, and the size of the camera 200 can also be reduced according to the reduction of the area of the bottom surface, thereby achieving a reduction of the occupied space of the camera 200.

In the second embodiment of the present invention, a display device (not shown) includes the flexible display panel 100 as the above description and a camera 200, wherein the camera 200 is disposed on the side near the base layer structure of the flexible display panel 100 and corresponds to the transparent display area. The display device has the effect of full screen display and can be any product or device with display function (e.g.: mobile phones, tablets, laptop, etc.).

In the second embodiment of the present invention, several refractive layer structures 60 are disposed in the flexible display panel 100. The refractive layer structure 60 is a combination of several refractive layers and a reflective layer 70, and the refractive layer structure 60 is a graded refractive index structure that the refractive indexes of refractive layers are sequentially increased. When lights enter the transparent display area, due to the refractions and the reflections in the refractive layers and the reflective layer 70 of the refractive layer structure 60, the incident lights from different directions converge to a bundle of light, pass through the flexible display panel 100, and then focus on the camera 200, which increases the total light transmittance of the film layers in the camera 200 area to make the camera 200 behind the display panel receive sufficient lights and increase the brightness of the collected image and the image quality, thereby realizing a better under-display camera technique.

While the present invention will be described with reference to particular embodiments herein, it should be understood that these embodiments are merely illustrative of the principles and applications of the present invention. Therefore to be understood that numerous modifications may be made to the illustrative embodiments and other arrangements may be devised, the spirit and scope of the invention without departing from the as defined by the appended claims. It should be appreciated that different features may be combined in the dependent claims and described herein by way different from that described in the original claims. It is also understood that the binding characteristics of the embodiments described in separate embodiments may be used in the other embodiments.

What is claimed is:

1. A flexible display panel, comprising:
   a display area, the display area comprising a transparent display area and a non-transparent display area surrounding the transparent display area;
   wherein in the display area, the flexible display panel comprises:
   a base layer structure;
   a thin film transistor layer disposed on the base layer structure;
   an organic light emitting diode layer disposed on the thin film transistor layer; and
   a packaging layer disposed on the organic light emitting diode layer; and
   wherein in the transparent display area, the flexible display further comprises at least one set of refractive layer structure; and
   the refractive layer structure comprises:
   a first refractive layer comprising a light incident side and a light outgoing side;
   a second refractive layer comprising a light incident side and a light outgoing side, wherein the light incident side of the second refractive layer is disposed on the light outgoing side of the first refractive layer; and
   a third refractive layer comprising a light incident side and a light outgoing side, wherein the light incident side of the third refractive layer is disposed on the light outgoing side of the second refractive layer;
   wherein the refractive index of the first refractive layer is lower than the refractive index of the second refractive layer; and
   wherein the refractive index of the second refractive layer is lower than the refractive index of the third refractive layer.

2. The flexible display panel as claimed in claim 1, further comprising a reflective layer surrounding the periphery of the refractive layer structure.

3. The flexible display panel as claimed in claim 1, wherein the refractive layer structure is cylindrical or truncated cone and comprises a bottom surface and a top surface,
   wherein the top surface is at the light incident side of the first refractive layer,
   wherein the bottom surface is at the light outgoing side of the third refractive layer; and
   wherein the diameter of the bottom surface is equal to or smaller than the diameter of the top surface.

4. The flexible display panel as claimed in claim 1, wherein when the flexible display panel comprises two or more refractive layer structures, the diameter of the top surface of the lower level refractive layer structure is equal to or smaller than the diameter of the bottom surface of the upper level refractive layer structure.

5. The flexible display panel as claimed in claim 1, wherein the refractive layer structure disposed in the base layer structure and/or the thin film transistor layer, and corresponding to the transparent display area.

6. The flexible display panel as claimed in claim 5, wherein the base layer structure comprises:
   a first base layer;
   a first barrier layer disposed on the first base layer;
   a second base layer disposed on the first barrier layer; and
   a second barrier layer disposed on the second base layer,
   wherein the thin film transistor layer is disposed on the second barrier layer;
   wherein when the refractive layer structures are disposed on the base layer structure, the refractive layer structures are disposed on the first base layer and the second base layer.

7. The flexible display panel as claimed in claim 1, wherein the organic light emitting diode layer comprises a plurality of pixels arranged in an array on the thin film transistor layer;
   wherein a pixel density of the transparent display area is less than a pixel density of the non-transparent display area; and
   wherein a pixel size of the transparent display area is less than a pixel size of the non-transparent display area.

8. The flexible display panel as claimed in claim 7, wherein the organic light emitting diode layer further comprises a light blocking layer disposed on the organic light emitting diode layer and surrounding the transparent display area.

9. A display device, comprising the flexible display panel as claimed in claim 1 and a camera, wherein the camera and the transparent display area correspond to each other.

10. A flexible display panel, comprising:
    a display area, the display area comprising a transparent display area and a non-transparent display area surrounding the transparent display area;
    wherein in the display area, the flexible display panel comprises:
    a base layer structure;
    a thin film transistor layer disposed on the base layer structure;
    an organic light emitting diode layer disposed on the thin film transistor layer; and
    a packaging layer disposed on the organic light emitting diode layer; and wherein in the transparent display area, the flexible display further comprises at least one set of refractive layer structure;
   wherein the organic light emitting diode layer comprises a plurality of pixels arranged in an array on the thin film transistor layer;
   wherein a pixel density of the transparent display area is less than a pixel density of the non-transparent display area; and
   wherein a pixel size of the transparent display area is less than a pixel size of the non-transparent display area.

11. The flexible display panel as claimed in claim 10, wherein the organic light emitting diode layer further comprises a light blocking layer disposed on the organic light emitting diode layer and surrounding the transparent display area.

\* \* \* \* \*